United States Patent
Yamayoshi et al.

[19]

[11] Patent Number: 6,160,260
[45] Date of Patent: *Dec. 12, 2000

[54] PHOTOELECTRIC CONVERSION DEVICE, AND SYSTEM AND IMAGE READING METHOD USING THE DEVICE

[75] Inventors: Junichi Yamayoshi; Yutaka Endo, both of Utsunomiya; Noriyuki Kaifu, Hachiouji; Isao Kobayashi, Atsugi; Toshio Kameshima, Sagamihara; Hideki Nonaka, Utsunomiya; Takashi Ogura, Tokyo, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/821,439

[22] Filed: Mar. 21, 1997

[30] Foreign Application Priority Data

Mar. 26, 1996 [JP] Japan .................................... 8-070188
Mar. 10, 1997 [JP] Japan .................................... 9-054598

[51] Int. Cl.$^7$ .................................................. H04N 5/32
[52] U.S. Cl. ................................ 250/370.09; 250/370.11
[58] Field of Search .......................... 250/370.09, 370.08, 250/370.01, 370.11; 257/291, 292, 443

[56] References Cited

U.S. PATENT DOCUMENTS 4,575,638  3/1986  Okumura .................................. 250/578
5,128,735  7/1992  Ohmi et al. ............................. 257/443

FOREIGN PATENT DOCUMENTS

0296603  12/1988  European Pat. Off. ......... H04N 1/04
0660421   6/1995  European Pat. Off. .
05110951  4/1993  Japan .

Primary Examiner—Seungsook Ham
Assistant Examiner—Richard Hanig
Attorney, Agent, or Firm—Fitzpatrick, Cella, Harper & Scinto

[57] ABSTRACT

A photoelectric conversion device includes a plurality of photoelectric conversion elements arranged in a matrix to continuously read a noise-free image. The plurality of photoelectric conversion elements arranged in each row are commonly connected to respective refresh signal lines. The refresh signal lines are independently set up and respectively connected to refresh signal generators.

4 Claims, 5 Drawing Sheets

PHOTOELECTRIC CONVERSION DEVICE, AND SYSTEM AND IMAGE READING METHOD USING THE DEVICE

BACKGROUND OF THE INVENTION

1. Field of the Invention

The present invention relates to a photoelectric conversion device, and system and an image reading method using the photoelectric conversion device. More specifically, the invention relates to a photoelectric conversion device that is suitably used in radiation equipment such as an X-ray apparatus, a system and an image reading method using the photoelectric conversion device.

2. Description of the Related Art

In X-ray photographing for medical diagnosis purposes or for non-destructive testing of the internal structure of a test sample without destroying the sample, an X-ray photography uses an intensifying screen and an X-ray photographic film in combination in a still photograph fashion. In such photographing, when radioactive rays such as X-rays, that are transmitted through a specimen such as a human body or other objects, are incident on an intensifying screen, fluorescent materials contained in the intensifying screen absorb X-ray energy and emit fluorescence.

The X-ray photographic film is exposed to the fluorescence, and an X-ray image is formed on the film. The film is subjected to development and fixing processes to make the X-ray image visible.

A variety of techniques for digitally reading such an X-ray image have been recently developed. For example, one technique employs X-ray imaging means including an X-ray sensitive photoelectric conversion device which converts detected X-rays into an electrical signal according to the intensity of the X-rays, a fluorescent body capable of absorbing X-ray energy that emits fluorescence in accordance with the intensity of the X-rays, and a visible light sensitive photoelectric conversion device which converts the visible light into an electrical signal according to the intensity of the visible light. According to this technique, an X-ray image is converted into an electrical signal, which is then A/D converted and read digitally.

European Unexamined Patent Publication EP0660421A discloses one example of a photoelectric conversion element that uses amorphous silicon (a-Si) as a photoelectric conversion material.

Figure 1:
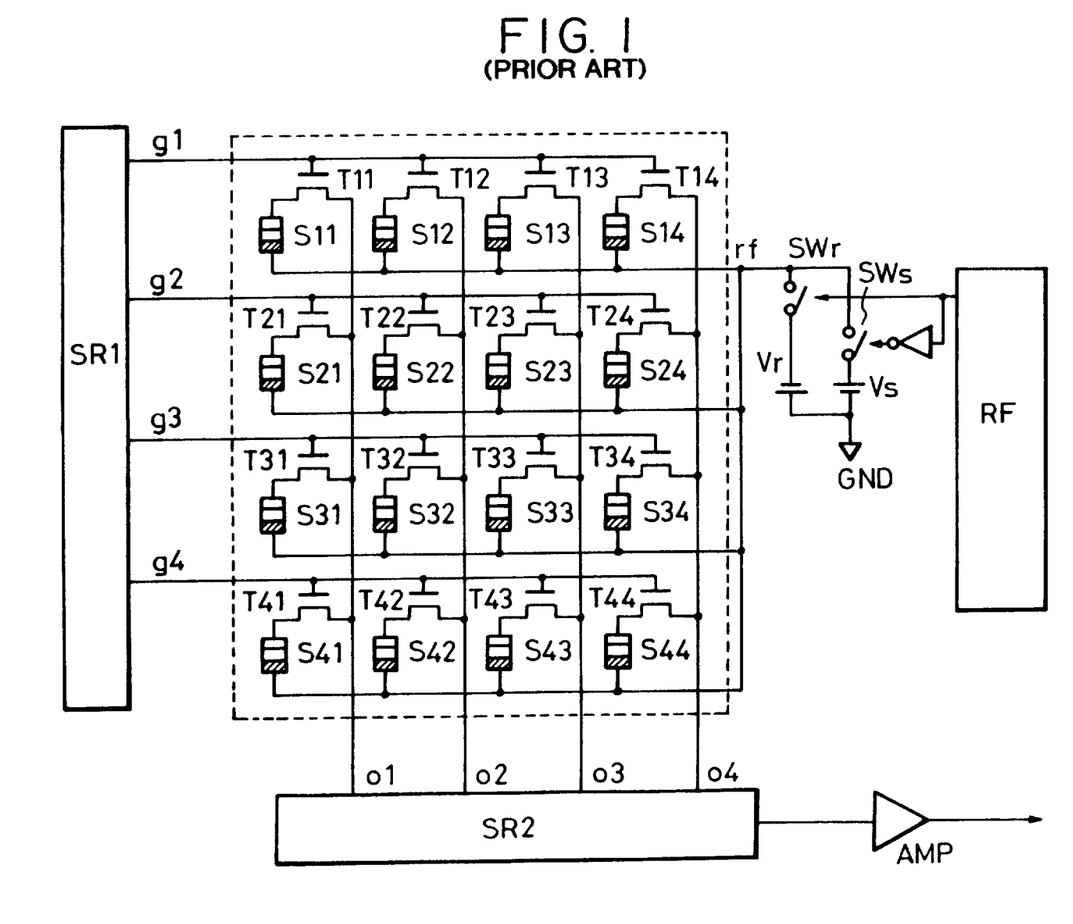
FIG. 1 is a schematic diagram showing one example of a photoelectric conversion device.

FIG. 1 is a schematic diagram of a photoelectric conversion device incorporating this photoelectric conversion element. As shown, S11 through S44 are photoelectric conversion elements. T11 through T44 are switching TFTs (thin film transistors). A reading power supply Vs and a refresh power supply Vr are connected to the drains of photoelectric conversion elements S11 through S44 via switches SWs and SWr, respectively. The SWs is connected via an inverter to a refresh control circuit RF and the switch SWr is directly connected to the refresh control circuit RF. The switch SWr is on during the refresh period and the switch SWs is on for the rest of time. Also shown are refresh lines rf, gate driving lines g1 through g4, reading lines o1 through o3, and shift registers SR1 and SR2.

One pixel or cell is constructed of a photoelectric conversion element and a switching TFT, and the output signal of the cells selected by the shift register SR1 as a row address selection circuit is sequentially output by the shift register SR 2 as a transfer circuit and is then amplified by an Amp to a desired level.

SUMMARY OF THE INVENTION

It is an object of the present invention to provide a photoelectric conversion device and a system incorporating the photoelectric conversion device, which are capable of outputting a high S/N ratio signal bearing image information.

It is another object of the present invention to provide a photoelectric conversion device and a system incorporating the photoelectric conversion device, which continuously performs image reading or performs image reading without a refresh operation and with no idle period being introduced.

It is yet another object of the present invention to provide a photoelectric conversion device and a system incorporating the photoelectric conversion device, which are simply constructed without increasing the number of manufacturing steps and which permits a reliable image reading.

It is still yet another object of the present invention to provide an image reading method that achieves the above objects of the present invention.

According to the present invention, a photoelectric conversion device includes a plurality of photoelectric conversion elements respectively which are connected to a plurality of refresh signal lines and which are arranged in a matrix, wherein the plurality of photoelectric conversion elements are divided into a plurality of groups and the photoelectric conversion elements in each group are commonly connected to a respective line of the plurality of refresh signal lines.

According to the present invention, a system includes a photoelectric conversion device having a plurality of photoelectric conversion elements respectively connected to a plurality of refresh signal lines and an image processing device for processing information from the photoelectric conversion device, wherein the plurality of photoelectric conversion elements are divided into a plurality of groups, and the photoelectric conversion elements in each group are commonly connected to a respective line of the plurality of refresh signal lines.

According to the present invention, an image reading method employed in a photoelectric conversion device including a plurality of photoelectric conversion elements arranged in a matrix includes the step of inserting a signal reading operation, not related to image information reading, between a refresh operation for refreshing the photoelectric conversion elements and a reading operation for reading an image information bearing signal from the photoelectric conversion elements.

DESCRIPTION OF THE PREFERRED EMBODIMENTS

Referring to the drawings, the embodiments of the present invention are now discussed.

Figure 2:
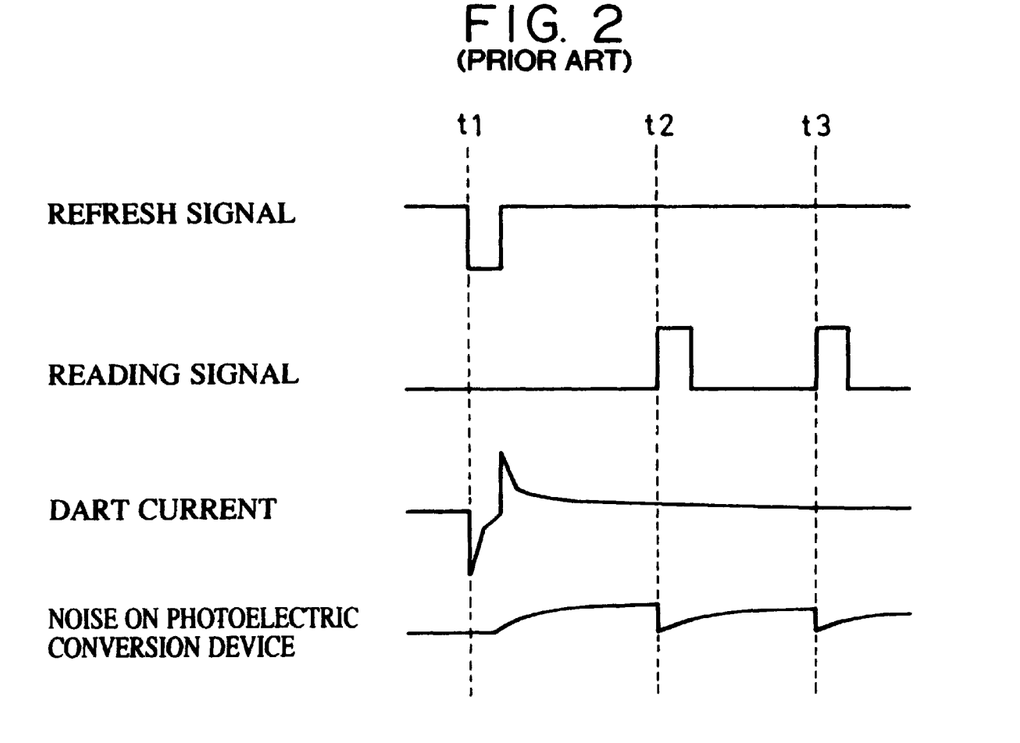
FIG. 2 is a timing diagram showing noise resulting from a dark current.

FIG. 2 shows one example of the reading timing for image data in a photoelectric conversion device shown in FIG. 1.

As shown, when a refresh operation is performed at time t1, a large magnitude dark current occurs immediately in succession to it, and the dark current is stored as a charge in the photoelectric conversion element. When the image data is actually read from the photoelectric conversion element, the stored charge is drained at a preliminary reading (time t2) prior to a real reading (time t3).

Noise in the image data is known to be proportional to the square of stored charge resulting from the dark current. A fixed duration after the preliminary reading, the reading operation is performed. Charge resulting from the dark current is accumulated between the preliminary reading and the real reading, and the amount of charge is preferably small. Since the dark current becomes smaller with time, noise at the reading operation is lowered by delaying the preliminary reading as long as possible.

However, if the time from the refresh operation to the preliminary reading is greatly prolonged, the number of reads permitted per a fixed period of time are lowered. Depending on the time of delay, a continuous image output (dynamic image) cannot be produced.

Such a problem is resolved by dividing the cells into a plurality of groups and refreshing them group by group rather than concurrently refreshing all of the cells.

Specifically, the refresh signal lines are divided into a plurality of groups so that each group is separately refreshed. For example, the refresh signal lines may be connected to a refresh signal generator capable of separately driving the lines, or may be connected to a common refresh signal generator means via a refresh line selection means such as a switch.

To shorten reading operation intervals, one of the groups of photoelectric conversion elements that are divided according to the grouping of the refresh signal lines is selectively driven while at least one of the remaining groups of photoelectric conversion elements is refreshed.

The above process is detailed below.

To acquire image data in the form of an electrical signal derived from an optical signal, photoelectric conversion elements are divided into two groups, first group lines (one array of photoelectric conversion elements) and second group lines. The first group lines and the second group lines are refreshed at different timings. Image data is continuously read from the first group lines from the time when the first group lines are selected until they are refreshed. During a signal reading disabled period subsequent to the refreshing of the first group (for example, from a refresh time Trf1 to a subsequent preliminary reading in FIG. 3), image data is read from the second group lines. The above process is repeated, and the first group cells and the second group cells thus alternately read a low-noise image in a continuous fashion. The photoelectric conversion elements may be divided into three or more groups, which are then separately refreshed for continuous low-noise image reading.

In radioactive ray equipment incorporating the photoelectric conversion device of the present invention, radioactive rays such as X-rays are converted by a wavelength converting material such as a fluorescent body (a scintillator, for example) into light within a wavelength range in which the photoelectric conversion element is light sensitive or within a wavelength range that includes a wavelength to which the photoelectric conversion element is highly sensitive. The light is introduced into the photoelectric conversion device of the present invention in which the photoelectric conversion elements are two-dimensionally arranged in a matrix. A low-noise image is thus continuously read. Besides X-rays, the radioactive rays include $\alpha$-rays, $\beta$-rays, $\gamma$-rays and the like. Radioactive rays may be converted to ultraviolet light.

Figure 4:
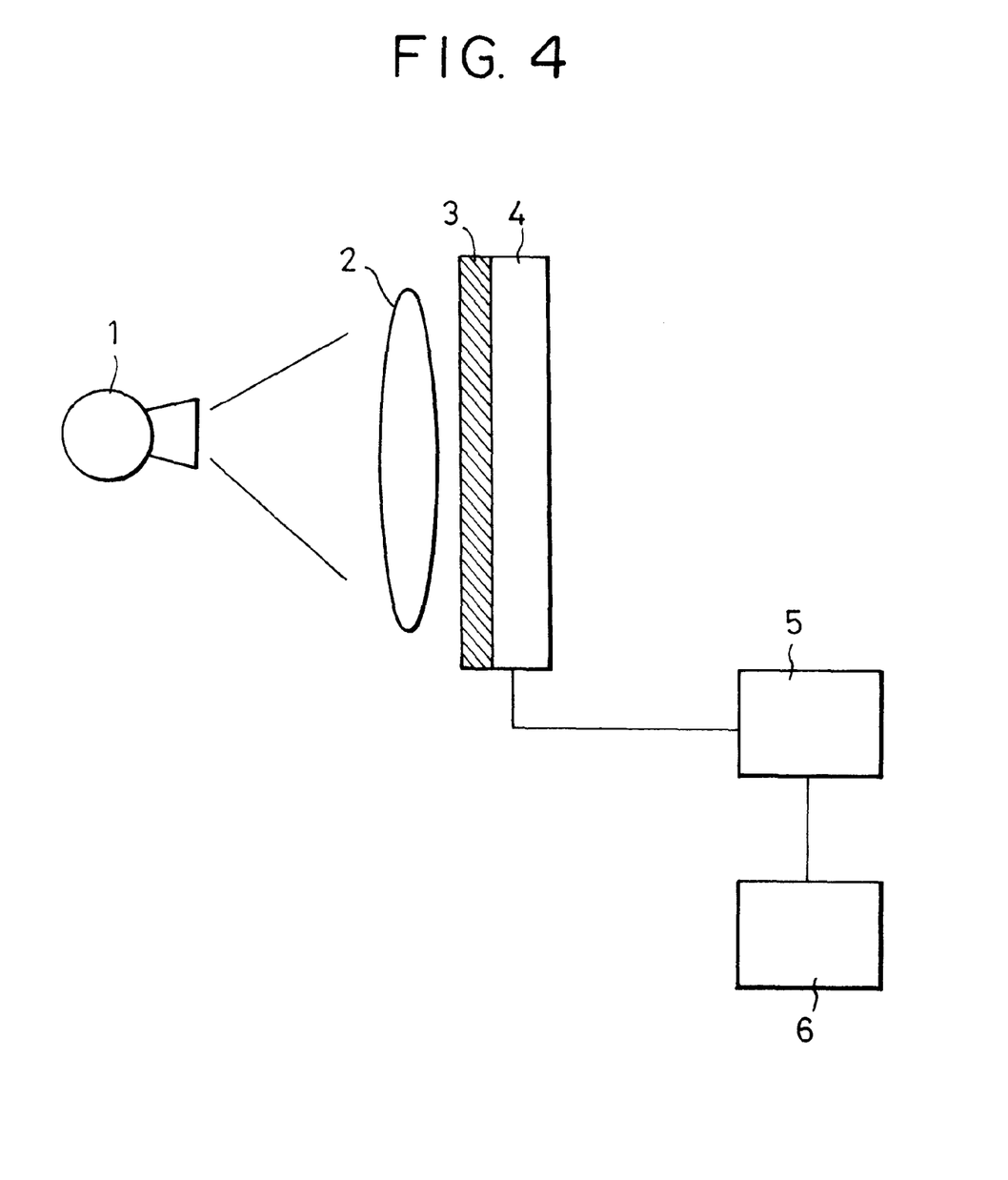
FIG. 4 is a block diagram showing an image reading system incorporating the photoelectric conversion device.

FIG. 4 is a diagrammatic view showing an X-ray imaging apparatus that is one of the systems into which the photoelectric conversion device of the present invention is incorporated. Shown in FIG. 4 are an X-ray generator 1, an object 2, a scintillator 3, a photoelectric conversion device 4, and an image processing device 5 and a device 6. X-rays emitted from the X-ray generator 1 are transmitted through the object 2, and are converted into light proportional to the incident dose of X-rays. The light is then converted into an electrical signal by the photoelectric conversion device 4, and is sent to the image processing device 5. The X-ray generator is a light source that emits a wave of a required wavelength, and if the photoelectric conversion device 4 is sensitive to that wave, the scintillator 3 is dispensed with.

Figure 5:
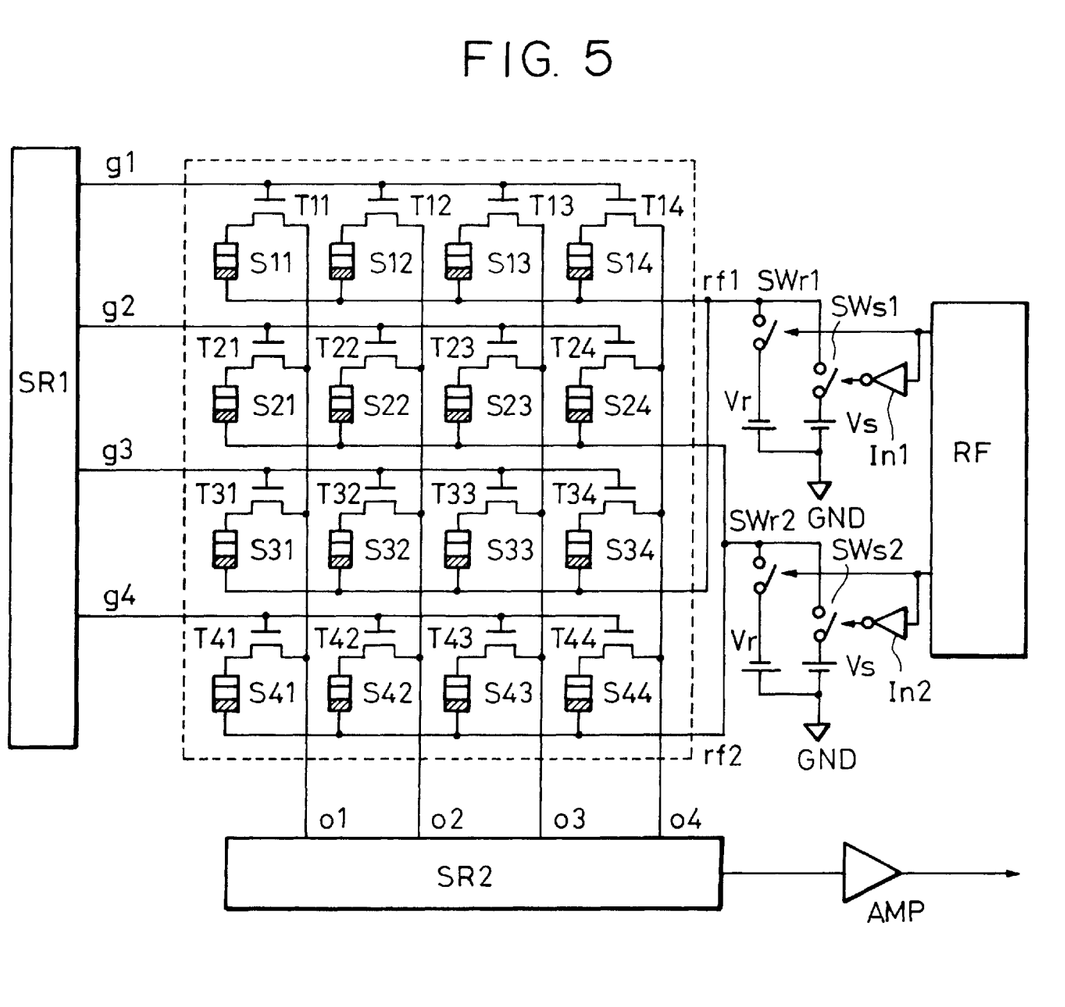
FIG. 5 is a schematic diagram of one embodiment of the photoelectric conversion device of the present invention.

FIG. 5 is a schematic diagram showing the photoelectric conversion device of the present invention. In FIG. 5, the components identical to those described with reference to FIG. 1 are designated with the same reference numerals. The photoelectric conversion device shown in FIG. 5 may be used as the photoelectric conversion device shown in FIG. 4 in the same way the photoelectric conversion device shown in FIG. 1 is used as the photoelectric conversion device shown in FIG. 4.

As shown, S11 through S44 are photoelectric conversion elements. Each of the photoelectric conversion elements S11 through S44 has upper and lower electrodes in this embodiment. T11 through T44 are switching TFTs. Vs designates reading power supplies and Vr designates refresh power supplies. Vs and Vr are respectively connected to the drains of photoelectric conversion elements S11 through S14 and S31 through S34 via a refresh signal line rf1 through switches SWs1 and SWr1, respectively. Vs and Vr are respectively connected to the drains of photoelectric conversion elements S21 through S24 and S41 through S44 via a refresh signal line rf2 through switches SWs2 and SWr2, respectively.

Switches SWs1, SWs2 are connected to a refresh control circuit RF via inverters In1, In2, respectively, and switches SWr1 and SWr2 are directly connected to the refresh control circuit RF. Either SWr1 or SWr2 is on during the refresh period, and either SWs1 or SWs2 is on for the rest of time. The refresh power supply Vr, switch SWr1, and refresh control circuit RF constitute a refresh signal generator, and the refresh power supply Vr, switch SWr2, and refresh control circuit RF constitute another refresh signal generator. Switching means for switching between a refresh operation and reading operation is constituted by the switches and inverters.

One pixel or cell is constructed of a photoelectric conversion element and a switching TFT, and the output signal of the cells selected by the shift register SR1 as a row address selection circuit is sequentially output by the shift register SR2 as a transfer circuit.

Figure 3:
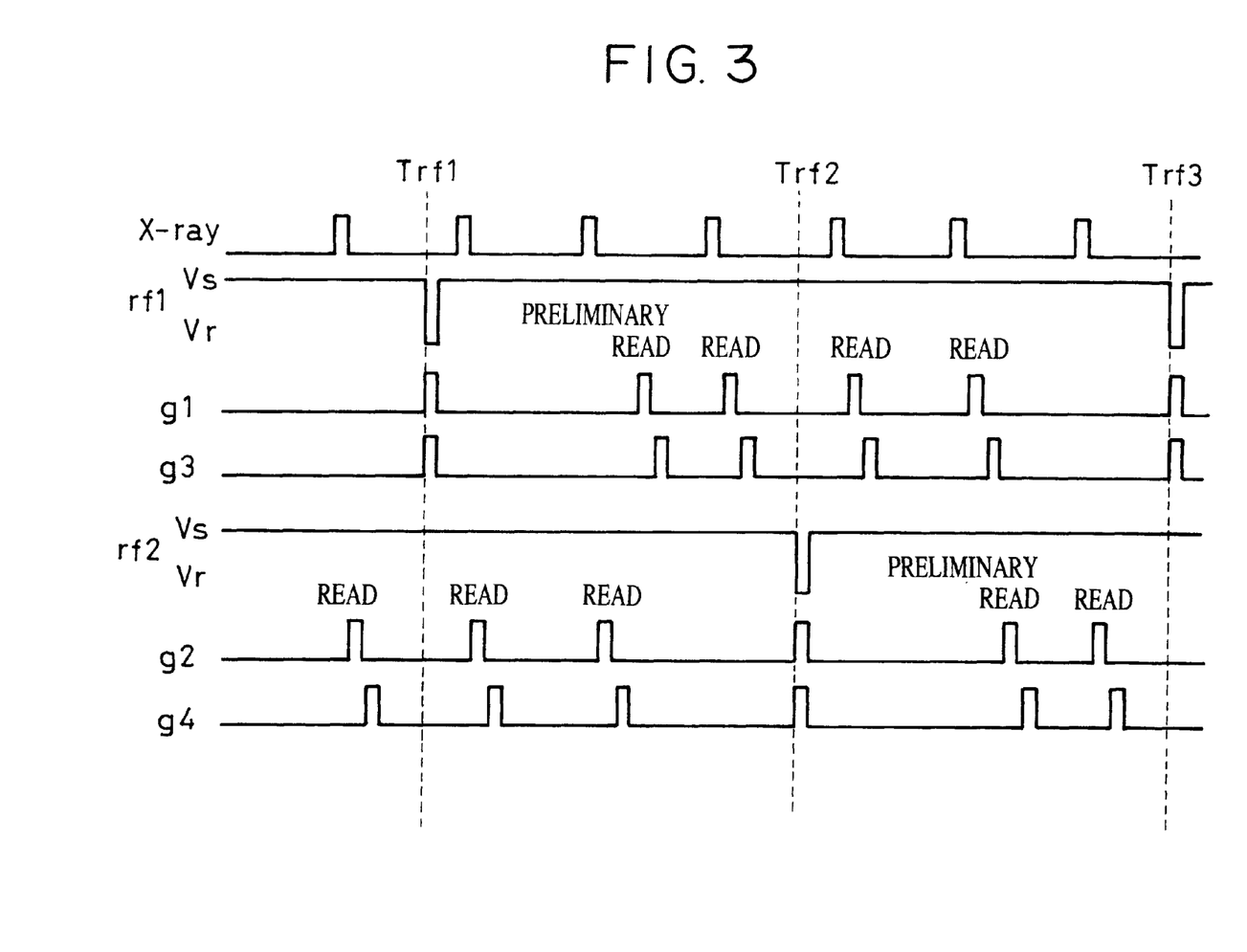
FIG. 3 is a timing diagram showing the driving operation of the photoelectric conversion device.

FIG. 3 is a timing diagram showing the timings of X-ray irradiation, image reading and refresh operation according to the present invention. Referring to FIGS. 3 through 5, the operation of the photoelectric conversion device is now discussed.

At time Trf1 shown in FIG. 3, the row address selection circuit SR1 shown in FIG. 5 drives control lines g1 and g3 high, and the transfer circuit SR2 enables output lines o1 through o4 to output signals, the refresh control circuit RF provides a high-level output to the switch SWr1 to turn it on, and the drains of first group photoelectric conversion elements S11 through S14 and S31 through S34 are driven to a negative voltage by the refresh voltage Vr. The first group photoelectric conversion elements are set to a refresh mode and then refreshed.

Next, the row address selection circuit SR1 drives control lines g1 and g3 low, the transfer circuit SR2 disables output lines o1 through o4, the refresh control circuit RF provides a high-level output to the switch SWs1 to turn it on, and the drains of the first group photoelectric conversion elements S11 through S14 and S31 through S34 are driven to a positive voltage by the reading voltage Vs. The first photoelectric conversion elements are set to a photoelectric conversion mode.

X-rays are emitted in the form of pulse as shown in FIG. 3, transmitted through the object, and converted into light proportional to the input dose of X-rays, and the light is introduced into the photoelectric conversion elements. Charge resulting from the light is accumulated in the photoelectric conversion elements. The row selection circuit SR1 drives the control line g1 high, the transfer circuit SR2 enables the output lines o1 through o4, and thus signal corresponding to charge accumulated in the photoelectric conversion elements S11 through S14 are sequentially output through the switching TFTs T11 through T14 and the transfer circuit SR2.

Next, with the control line g3 is driven high, a signal corresponding to charge accumulated in the photoelectric conversion elements S31 through S34 is sequentially output through the switching TFTs T31 through T34 and the transfer circuit SR2. Image data accumulated in the photoelectric conversion elements S11 through S14 and S31 through S34 is stored as one frame in memory means in the image processing device 5 shown in FIG. 4, and displayed on a display 6 as necessary. Reading of the X-ray image subsequent to the refresh is repeated an appropriate number of times until another refresh operation is required. As described above, a preliminary reading is performed prior to a reading when the image data is read from the photoelectric conversion elements.

At time Trf2 in the middle of image reading from the first group of photoelectric conversion elements S11 through S14 and S31 through S34, the row address selection circuit SR1 shown in FIG. 5 drives the control lines g2 and g4 high, the transfer circuit SR2 enables the output lines o1 through o4, the refresh control circuit RF provides a high-level output to the switch SWr2 to turn it on, and the drains of the second group of photoelectric conversion elements S21 through S24 and S41 through S44 are driven to a negative voltage by the refresh voltage Vr. The second group of photoelectric conversion elements are set to a refresh mode and thus refreshed.

The row address selection circuit SR1 drives control lines g1 and g3 low, the transfer circuit SR2 disables output lines o1 through o4, the refresh control circuit RF provides a high-level output to the switch SWs2 to turn it on, and the drains of the second group of photoelectric conversion elements S21 through S24 and S41 through S44 are driven to a positive voltage by the reading voltage Vs. The first photoelectric conversion elements are set to a photoelectric conversion mode.

From a next X-ray pulse at the moment the image reading from the first group is completed, the row address selection pulse SR1 drives the control line g2 high, and the transfer circuit SR2 enables the output lines o1 through o4, and a signal corresponding to the charge accumulated in the photoelectric conversion elements S21 through S24 is sequentially output through the switching TFTs T21 through T24 and the transfer circuit SR2.

Next, with the control line g4 is driven high, a signal corresponding to the charge accumulated in the photoelectric conversion elements S41 through S44 are sequentially output through the switching TFTs T41 through T44 and the transfer circuit SR2. Image data accumulated in the photoelectric conversion elements S21 through S24 and S41 through S44 is stored as one frame in memory means in the image processing device 5 shown in FIG. 4, and displayed on a display 6 as necessary.

The first group a photoelectric conversion elements S11 through S14 and S31 through S34 and the second group of photoelectric conversion elements S21 through S24 and S41 through S44 alternately performs image reading, preventing image blanking (from the refresh operation to the preliminary reading) in succession to the refresh operation.

In this embodiment, the two refresh signal lines of rf1 and rf2 are employed. Alternatively, the photoelectric conversion elements may be divided into four groups of S11 through S14, S21 through S24, S31 through S34, and S41 through S44 with each group having its own refresh signal line for controlling.

According to the present invention, as described above, the problem of S/N drop resulting from a dark current is solved, without employing a complicated arrangement, by performing a preliminary reading operation unrelated to a reading operation, subsequent to a refresh operation, and prior to a reading operation for image reading.

According to the present invention, by arranging a plurality of refresh signal lines for photoelectric conversion elements divided into a plurality of groups, the photoelectric conversion elements are refreshed on a group by group basis. Thus, the refresh operation and preliminary reading operation non-actual image reading are performed on a group by group basis, and the reading operation for actual image reading is performed substantially continuously with no idle period.

An image reading operation is performed on one group while a refresh operation and preliminary reading operation are performed on another group as appropriate. Thus, a continuous image reading is performed.

The present invention is not limited to the above embodiments, and various modifications and combinations thereof are possible without departing from the scope of the present invention.

What is claimed is:

1. An image reading method employed in a photoelectric conversion device comprising a plurality of photoelectric conversion elements arranged in a matrix, wherein the plurality of photoelectric conversion elements are divided into a plurality of groups, said method comprising the steps of:

reading an image information bearing signal from photoelectric conversion elements in the first group;

refreshing other groups independently from the first group, during a time the first group is read out, for photoelectric conversion elements in the other groups being refreshed; and reading a signal which does not relate to image information reading, between said refreshing step and said reading step.

2. An image reading method employed in a photoelectric conversion device comprising a plurality of photoelectric conversion elements arranged in a matrix, wherein the plurality of photoelectric conversion elements are divided into a plurality of groups, said method comprising the steps of:

reading an image information bearing signal from photoelectric conversion elements in the first group; and refreshing other groups independently from the first group during a time the first group is read out, for photoelectric conversion elements in the other groups being refreshed.

3. An image processing method employed in a photoelectric conversion device comprising a plurality of photoelectric conversion elements arranged in a matrix, wherein the plurality of photoelectric conversion elements are divided into a plurality of groups, said method comprising the steps of:

reading an image information bearing signal from photoelectric conversion elements in the first group;

refreshing other groups independently from the first group, during a time the first group is read out, for photoelectric conversion elements in the other groups being refreshed;

reading a signal which does not relate to image information reading, between said refreshing step and said reading step; and displaying the image or recording the image information on the basis of the read image information bearing signal.

4. An image processing method employed in a photoelectric conversion device comprising a plurality of photoelectric conversion elements arranged in a matrix, wherein the plurality of photoelectric conversion elements are divided into a plurality of groups, said method comprising the steps of:

reading an image information bearing signal from photoelectric conversion elements in the first group;

refreshing other groups independently from the first group during a time the first group is read out, for photoelectric conversion elements in the other groups being refreshed; and displaying the image of recording the image information on the basis of the read image information bearing signal.

* * * * *

UNITED STATES PATENT AND TRADEMARK OFFICE
CERTIFICATE OF CORRECTION

PATENT NO. : 6,160,260
DATED : December 12, 2000
INVENTOR(S) : Junichi Yamayoshi, et al.

It is certified that error appears in the above-identified patent and that said Letters Patent is hereby corrected as shown below:

Title page,
Item [56] References Cited, under FOREIGN PATENT DOCUMENTS
"05110951" should read -- 5-110951 --.

Column 1,
Line 67, "Amp" should read -- amplifier --.

Column 2,
Line 16, "permits" should read -- permit --.

Column 3,
Line 19, "are" should read -- is --.

Column 4,
Line 8, "device" (second occurrence) should read -- utilization device --.

Column 5,
Line 26, "is" should be deleted.

Column 6,
Line 3, "is" should be deleted;
Line 12, "a" should read -- of --; and
Line 15, "performs" should read -- perform --.

Signed and Sealed this

Thirteenth Day of November, 2001

Attest:

NICHOLAS P. GODICI
Attesting Officer    Acting Director of the United States Patent and Trademark Office